United States Patent [19]

Hassan et al.

[11] Patent Number: 4,474,397
[45] Date of Patent: Oct. 2, 1984

[54] PICK-UP HEAD UTILIZING ASPIRATED AIR FLOW

[75] Inventors: Javathu K. Hassan, Hopewell Junction; John A. Paivanas, Hyde Park, both of N.Y.

[73] Assignee: International Business Machines Corporation, Armonk, N.Y.

[21] Appl. No.: 442,206

[22] Filed: Nov. 16, 1982

[51] Int. Cl.³ .............................................. B66C 1/02
[52] U.S. Cl. .............................................. 294/64 B
[58] Field of Search ................ 294/64 B, 64 A, 64 R, 294/65; 414/737, 744, 752; 271/97, 98, 195

[56] References Cited

U.S. PATENT DOCUMENTS

| | | | |
|---|---|---|---|
| 4,002,254 | 1/1977 | Ologsen | 294/64 B |
| 4,029,351 | 6/1977 | Apgar et al. | 294/64 B |
| 4,257,637 | 3/1981 | Hassan | 294/64 B |

FOREIGN PATENT DOCUMENTS 2524916  9/1976  Fed. Rep. of Germany .... 294/64 B

Primary Examiner—James B. Marbert
Attorney, Agent, or Firm—Sughrue, Mion, Zinn, Macpeak, and Seas

[57] ABSTRACT

An aspirator jet suction pick-up device for moving green sheets or other flexible materials employs a source of gas under positive pressure into the head with exhaust via a network of slots disposed along the pick-up surface of the head. As the gas exhausts through the ends of the slots via a manifold or plenum, an open groove on the pick-up surface entrains aspirated air causing a localized suction force. The suction force due to aspiration uniformly and stably holds a flexible sheet on the pick-up surface.

18 Claims, 7 Drawing Figures

PICK-UP HEAD UTILIZING ASPIRATED AIR FLOW

BACKGROUND OF THE INVENTION

This invention relates to a pickup and transfer head for handling flexible and fragile materials. In particular, this invention relates to a pick-up and transfer head employing aspirated air flow to transfer flexible and fragile materials while maintaining them in a planar shape.

FIELD OF THE INVENTION

In the manufacture of semiconductor devices, ceramic modules having multiple layers require transportation during various processing steps. These modules comprise multiple layers of ceramic materials with each sheet or layers of the ceramic having a particular conductive pattern imprinted thereon. Typically, the layers are aligned to provide a stack of uncured ceramics which is then pressed and cured to form an integral ceramic package having a very large number of electrically connected conductive paths arranged therein. However, prior to curing, each of the layers and the stack itself is flexible and highly fragile.

In the prior art, a variety of techniques have been proposed and utilized to handle and stack these sheets known commonly as "green sheets". Techniques have evolved from hand-stacking to the use of suction devices. Given the fact that each individual green sheet is thin, and very flimsy, they are subject to stretching as well as local deformation if subjected to hand processing. To eliminate these problems, such as fingerprints, tearing and the like, a myriad of pick-up heads have been proposed to pick up and transfer green sheets between various processing steps without damaging the material. A standing requirement for all such devices is to define a device which is capable of supporting the green sheet on both its periphery and center to prevent stretching and tearing prior to subsequent process steps, such as imprinting, placement in a final stack and curing. Given the sensitivity of the material which is being handled, devices which are customarily used for the movement of cured (hard) wafers cannot be satisfactorily implemented for use in handling flimsy sheets.

One such prior art technique is based on lifting wafers by utilizing the Bernoulli or axi-radial flow phenomenon. In this technique, both attraction and repelling forces are generated when an axially directed stream inpinges on a flat surface (wafer) and then flows radially outward in a bounding flow passage configuration. If proper flow conditions are established, the attraction force dominates and the flat object is then lifted toward the transfer head. Such techniques are suitable for rigid planar materials but are not effective where flexible, fragile materials must be transported. The theory of "axi-radial" flow is discussed in U.S. Pat. No. 4,257,637.

Other devices to lift objects having a flat surface by means of this flow phenomenon are shown and described in U.S. Pat. Nos. 3,539,216 and 3,411,770. In U.S. Pat. No. 3,539,216, flow conditions are established in radially opposite directions across the surface of the body for lifting by Bernoulli effect. The flow may be directed in an unbalanced state over the surface to urge the wafer against a lateral restraint. In U.S. Pat. No. 3,411,770, a jet of air is directed vertically downward onto a stack of sheets. The velocity of the vertical stream in its radial excursion then creates a pressure differential acting to lift the top sheet of the stack when it is displaced at a predetermined position. Hence, a characteristic of both these prior art references is the use of both repelling and attraction forces which are generated when an axially directed gas stream impinges on a flat surface and then flows radially outward in a bounding flow passage. Under proper flow conditions, the attraction force tends to dominate and the object, if free to move, will then be lifted and drawn toward the opposite surface on the transfer head. Other examples of utilizing the Bernoulli effect for lifting and handling rigid planar materials with orientation by edge contact are shown in IBM Technical Disclosure Bulletin, Vol. 18, No. 6, pp. 1836-1837 (November 1975) and IBM Technical Disclosure Bulletin, Vol. 20, No. 2, pp. 593-594 (July 1977).

Also within the technology employing the Bernoulli theory are a group of pick-up heads which are used for lifting rigid planar wafers by edge contact. This technique is shown in U.S. Pat. No. 3,523,706 and U.S. Pat. No. 4,257,637. Reference is also made to IBM Technical Disclosure Bulletin Nos. Vol. 11, Vol 2, p. 112 (July 1968); Vol. 17, No. 1, p. 84 (June 1974); Vol. 18, No. 8, p. 2447 (January 1976); and Vol. 22, No. 5, pp. 1864-1865 (October 1979).

A technique distinguishable from Bernoulli effects in the prior art employs the application of a vacuum by which objects are lifted utilizing an array of suction ports on the transportation head which are in turn connected to a remote source of vacuum. The vacuum source may be either a vacuum pump or the throat section of a venturi tube. Typical are the techniques disclosed in U.S. Pat. No. 3,648,853 and U.S. Pat. No. 4,185,814. In U.S. Pat. No. 3,648,853, a plurality of pick-up vacuum cups are connected to the throat of a venturi tube to effectuate lifting of a flat work piece. In the U.S. Pat. No. 4,185,814, green sheet material is utilized under vacuum control employing a manifold system so that upon the application of a vacuum, pick-up occurs and by reversing the pressure such that a positive pressure exists, discharge of the sheets can then be effectuated. In utilizing vacuum techniques, flow-balancing between the port is extremely sensitive. Moreover, line clogging tendencies are known problems in vacuum systems. The technique of lifting objects in an efficient manner is therefore difficult because of the sensitive nature of the pressures utilized in such vacuum approaches.

The difficulties of vacuum systems when applied to the problem of pick-up and transportation of individual green sheets from an alternate sheet-spacer, layered stack will now be explained relative to FIGS. 1-3. As shown in FIG. 1A, a pick-up head is positioned in a fixed vertical position and has an arrangement of ports and slots through which a suction force is exerted by means of an attached vacuum source. A stack comprising alternate layers of green sheet material and spacers is moved upward toward the pick-up head at a stack approach velocity v. That is, the stack approaches the head at a given velocity and is then stopped in a position where the top green sheet is disposed in close proximity to the vacuum surface of the head. In actuality, the top green sheet is essentially in contact with that head surface. Continuous pumping through the head surface openings reduces the intervening pressure to a level where an average attraction force is attained which is equal to the weight of the individual green sheet. Thus, when the stack is then retracted, the top green sheet remains behind attracted to and held by the pick-up head.

There are, however, known deficiencies with this system. For example, the head may fail to pick up a sheet due to an insufficient attraction force. There is also a time-rate development of the attraction force which is a function of system parameters such as stack approach velocity, v, dwell time of the stack in proximity to the pick-up head, sheet flexibility, and the true surface spacing in the contact position. By true surface spacing, this parameter refers to the precision in stopping the stack at a predetermined head-stack spacing, h, as shown in FIG. 1A, the texture of the green sheet material and the like. Moreover, a prime consideration is the pumping effectiveness at the head surface. This parameter is a function of the number, size, shape, and arrangement of the suction ports, vis a-vis the "true" spacing in the dwell period.

As shown in FIG. 1B, as the stack approaches the pick-up head, air is momentarily entrapped between the surfaces of the top green sheet and the vacuum surface of the pick-up head. There is a tendency to create a pressure increase above ambient conditions; however, this tendency is continuously counteracted by suction pumping and by the initial flow expulsion from the space between the surfaces. Expulsion flow $q_e$ is shown in FIG. 1B along with the suction flow $q_s$. Within the dwell period, the pumping action must be sufficient to rapidly reduce the pressure to a level that will produce the required attraction force. If it is insufficient then the green sheet will not be retained by the pick-up head when the stack is retracted.

By model analysis as shown in FIG. 2 and FIG. 3, for a given pumping effectiveness, it can be shown that the force on the sheet characteristically reaches a maximum followed by a steady decrease to a negative value where it is equal to the sheet weight. The extent of this behavior is a function of the approach velocity v and thus, for higher approach velocities (i.e., shorter travel time), a correspondingly larger minimum dwell time is required to achieve pick-up conditions. FIG. 2A provides a force diagram showing the condition where equilibrium is not attained such that the green sheet will not be held by the head, while, FIG. 2B shows the force conditions necessary to establish pick up. In FIG. 2A the expulsion flow $q_e$ is directed outward, while in a pick-up condition the force $q_e'$, in FIG. 2B, is directed inwardly. During the transition period between the conditions shown in FIG. 2A and FIG. 2B the expulsion flow passes through zero.

FIG. 3 plots force F as a function of time and, for a given pumping effectiveness, the plots demonstrate that the force on the sheet characteristically goes through a maximum force value followed by a steady decrease to a minimum value or is equal to the sheet weight. In FIG. 3, $t_f$ is the travel time and $t_d$, is the dwell time at the pick-up condition height $h_f$. The curves establish the relationship $v_1 < v_2 < v_3$. In FIG. 3, at $t=0: h=h_0$ as shown in FIG. 2A. For $t=t_f: h=h_f$ as shown in FIG. 2B.

Given the operational variations inherent in such suction systems, the pick-up condition will not be attained in every cycling of the stack. One way to reduce the incidence of this occurrence is to decrease the approach velocity while increasing the dwell time. Such a technique reduces the maximum force while providing more than the minimum dwell time for the generation of the pick-up force. FIG. 3 shows increasing dwell time $t_d$ at the pick-up position $h_f$. Such a technique, however, is not completely sufficient to eliminate the problem in view of other variations inherent in pumping systems. For example, pumping effectiveness is especially important. In existing devices utilizing ports and slots, together with a vacuum pump, the suction process is essentially of the "sink" type. Hence, careful sheet-head positioning requirements are generally involved to most effectively utilize the suction field effect created by the ports on the lower side of the pick-up head. The field effect can be enhanced, for example, by the use of a larger number of small diameter ports which are spread to a larger extent over the vacuum head surface. Such an approach, however, involves increased practical problems, such as pressure drop-flow limitations between ports, and pumps, problems of port clogging and the like.

SUMMARY OF THE INVENTION

Given these deficiencies in the prior art, the present invention is related to a different technique of achieving lifting by creating a suction field. The present invention, however, does not require a vacuum source but rather is based on the recognition that the aspiration properties of the gas jet provide the necessary force characteristics to uniformly and gently lift and hold flat delicate objects, such as green sheets. By the use of a particular structure incorporating multiple gas jets, the aggregate aspiration effects are manifested as a suction effect at the lower surface of the pick-up device. Consequently, when a green sheet is placed in proximity to this surface, it will be attracted and held in place.

It is therefore an object of the present invention to provide a device that will pick up delicate objects, such as green sheets and transport them for processing.

Another object of the present invention is to provide a pick-up head that utilizes the aspiration effects of an air jet to attact a flat surface placed in proximity to the device surface to be drawn to and held in place.

A further object of the present invention is to define a pick-up device of simple construction that will provide for a given weight-lifting capability with uniform results with minimum flow requirements.

Yet another object of the present invention is to define a pick-up head that does not require a vacuum source, thereby eliminating problems of line clogging and having a device which is insensitive to practical variations in established flow.

A still further object of this invention is to provide a pick-up head that due to aspirated air flow self-aligns the objects to be picked-up on the head and inherently remove any foreign particles from the surface of the object.

These and other objects of this invention are attained in a pick-up head which utilizes the aspirator power of a partially confined gas jet. Aspirator-jet slots may be provided at both the inner and outer peripheral regions of the head. Jets which discharge along the floor regions of slots produce local suction effects due to the aspiration characteristics of the flow. This, in turn, produces a focused flow effect wherein surrounding air is continuously drain into the multiple slots and is carried away by the jet streams. As a result, when a reasonably flat surface, whether a rigid wafer or a flexible green sheet, is placed in proximity of the device surface, it will be rapidly drawn to that surface and held in place.

The holding and/or lifting capability is a function of the slot configuration and dimension, slot pattern as well as a supply flow rate. The slot must be elongated;

a series of discrete ports serially aligned will not achieve aspiration conditions. Although shown in the embodiments as straight, the slots may be curved or sinuous. Because the weight-lifting capability is a function of flow rate, variations in the basic device can be effectively utilized, such as utilizing slots only on the outer peripheral regions of the pick-up head.

In comparison with existing devices utilizing ports connected to a vacuum pump by using aspirator characteristics construction is inherently simplified yet positive performance advantages are attained. One principal advantage is that the aspirated air flow characteristics produce a larger integrated suction effect over a larger region of the head. Thus, a sheet is more effectively attracted to the surface of the device, an important criterion in the case of flexible easily damaged green sheets. Moreover, because pressurized jets are used to create suction, line clogging tendencies are minimized. In operation, the device is thoroughly insensitive to variations in flow conditions.

Other objects, advantages and a complete description of the invention will be set forth with reference to the following detailed description and claims taken with the accompanying drawings.

DESCRIPTION OF THE PREFERRED EMBODIMENTS

Figure 1A:
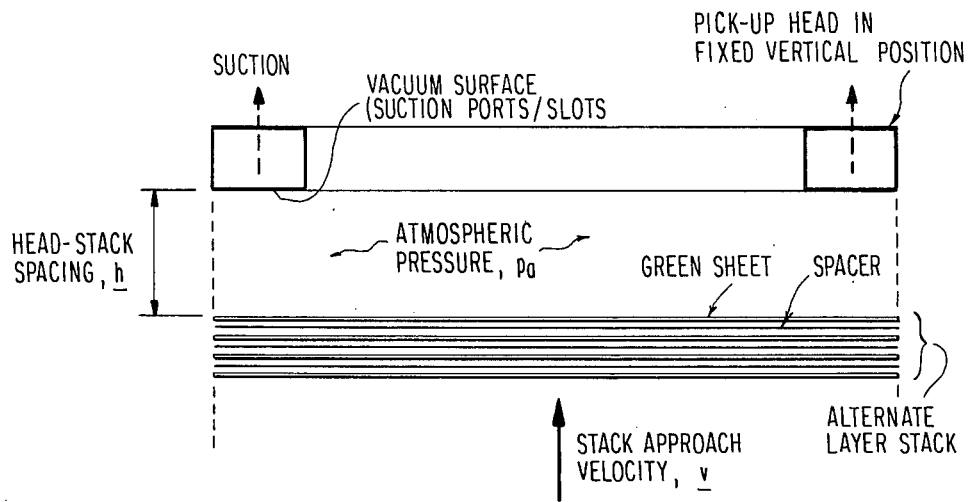
FIG. 1A and FIG. 1B are schematic cross sections of pick-up devices showing the relationship of the object being picked up with the device.
Figure 1B:
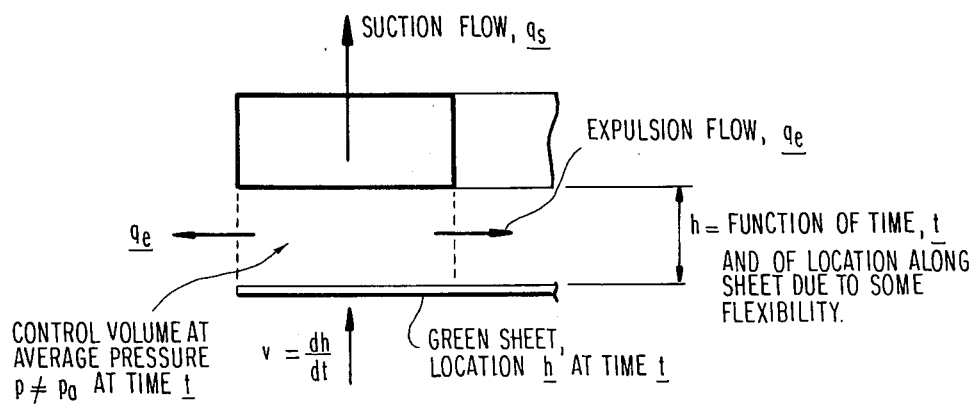
Figure 2A:
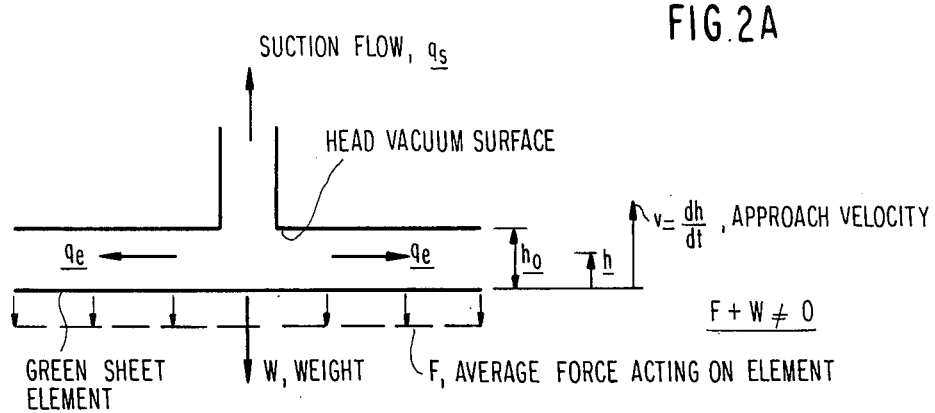
FIG. 2A and FIG. 2B are schematic cross sections of a prior art pick-up device utilizing suction techniques.
Figure 2B:
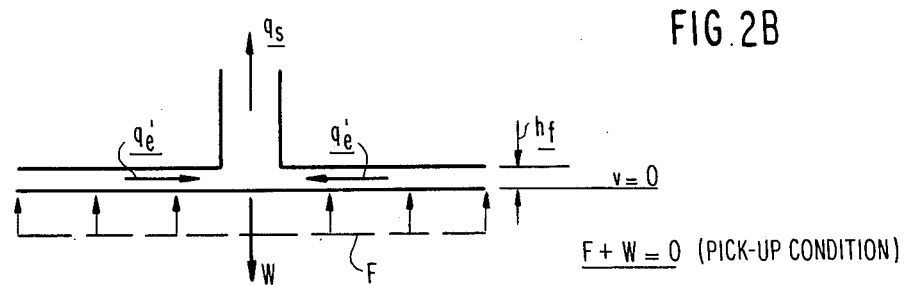
Figure 3:
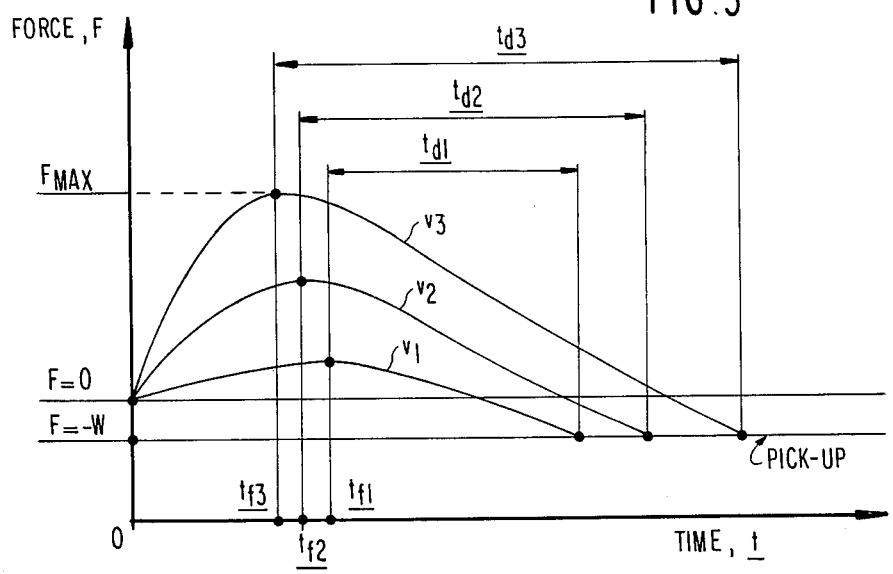
FIG. 3 is a graph showing the relationship of a force as a function of time for operation of a suction device.
Figure 4:
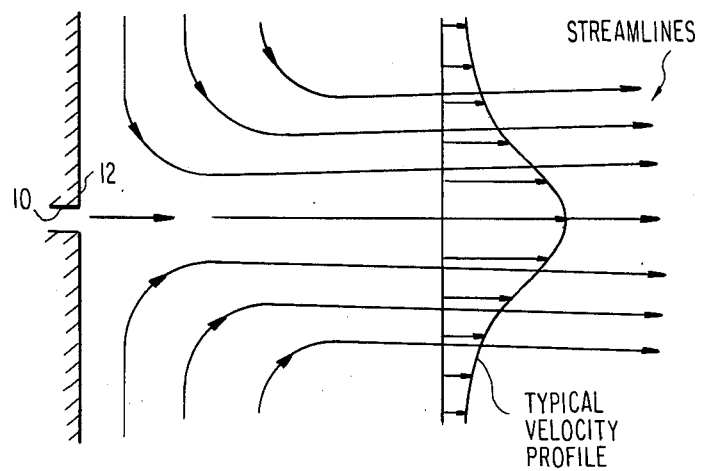
FIG. 4 is a schematic view showing air flow lines of a free jet issuing into atmosphere including aspirated air flow.

Referring now to FIG. 4, streamlines of a free jet issuing into the atmosphere are shown. In FIG. 4, a supply orifice 10 produces an air jet having a flow path substantially perpendicular to a wall portion 12. The air issuing from the jet may be either laminar or turbulent. Flow lines created by aspirated flow are generated as shown in FIG. 4. That is, due to entrainment of the issuing air jet, streamlines are created which are directed inwardly and generally parallel to the wall surface 12 and then define streamlines generally parallel to the air jet. Flow rates tend to increase in the axial direction. A typical velocity profile (normal to the axial direction) is shown in FIG. 4 for the air jets and the aspirated air flow. Hence, a free air jet issuing into the atmosphere characteristically entrains surrounding air. This flow condition can be used by confining the jet on three sides to focus the aspiration effect into a slot region.

Figure 5:
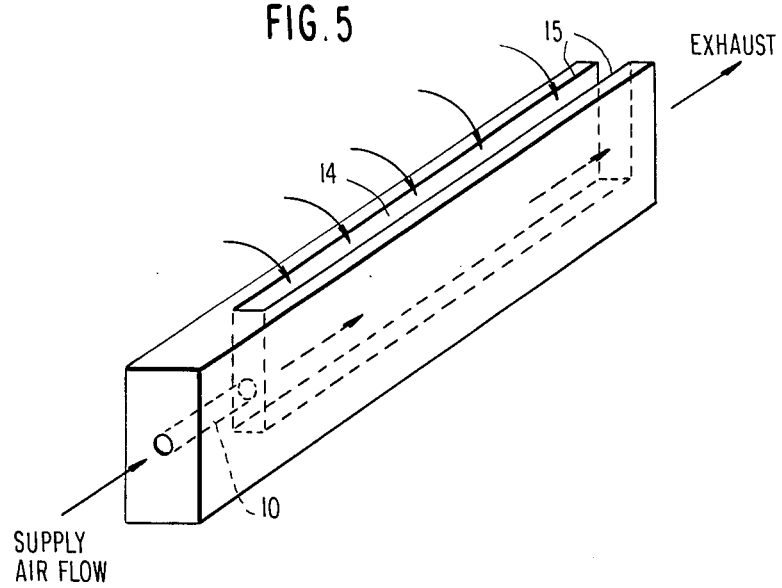
FIG. 5 is a perspective view of one embodiment illustrating the aspiration characteristics of a confined air jet in a slot wall system.

Reference is made to FIG. 5 illustrating one embodiment of this invention. An orifice 10 receives a supply of air and discharges it into a slot 14. This embodiment shows a single slot system. The slot has three wall surfaces and an opening defining a suction slot. Due to aspirated air flow into the slot, a suction region occurs. The entraining or aspiration effect is therefore focused into the slot region which exists over a large portion of the slot. The magnitude and extent of the suction are a function of the slot geometry and supply flow conditions. As shown in FIG. 5, the slot 14 is elongate and straight. The elongate dimension relative to slot width is necessary to achieve steady state aspiration. A series of ports, each discrete over the same slot length would not achieve steady state conditions.

The slot edges 15 are shown to be sharp, orthogonal to the slot openings. Improved flow characteristics may be achieved by radiusing these edges to promote laminar flow around the corner. The slot need not be straight. In some applications a curved or sinuous slot may be employed.

Utilizing these flow characteristics and the single slot system, FIGS. 6A, 6B, 6C, and 6D illustrate a second embodiment of the present invention. This embodiment utilizes two components, a plate 20 having the air supply flow and nozzle 10 and a plenum 22.

Figure 6A:
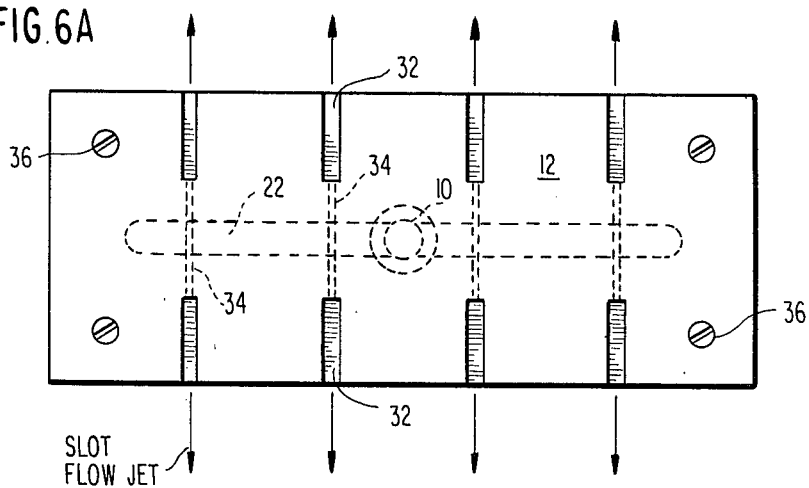
FIG. 6A, FIG. 6B, FIG. 6C, and FIG. 6D are bottom plan, side, and elevation views, respectively, of the second embodiment of this invention.
Figure 6B:
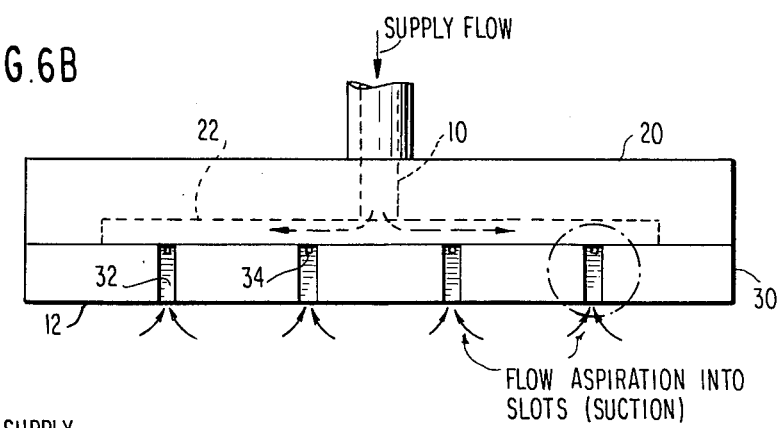
Figure 6C:
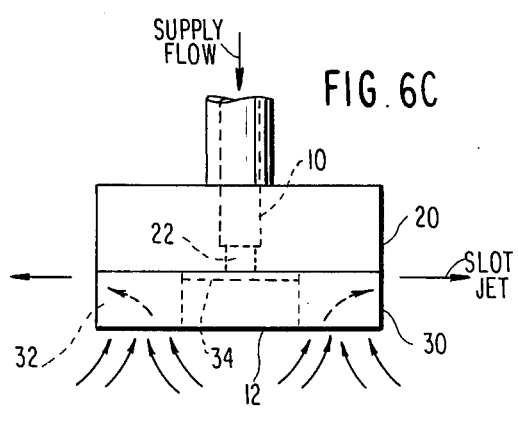
Figure 6D:
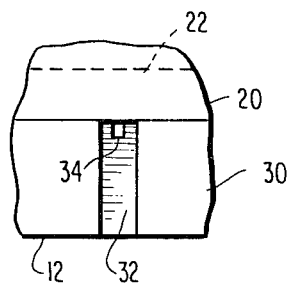

The second member 30 contains a series of slots 32 positioned radially outward from the bottom surface and in fluid communication with the plenum 22 by means of a network of feed orifices 34. As shown in FIG. 6A, a bottom plan view, each pair of slots 32 is coupled to the plenum 22 by a single feed orifice 34. The plenum in turn is coupled to the supply flow by means of the nozzle 10. Members 20 and 30, generally metallic, are coupled together at their corners by any conventional coupling device 36. Hence, in the bottom member 30, a series of parallel slots 32 and orifice feed grooves 34 are machined into that member. The member and placement of the slots 32 is a function of the ultimate utilization of the device vis-a-vis the material to be handled. The top member 20 contains the plenum and flow supply port with the two members attached as shown in FIG. 6B.

Gas under pressure is then supplied from nozzle 10 into the plenum 22. It is via the feed orifices 34 into the slots where, as shown in FIG. 6A, a slotted flow jet emanates. As shown in FIGS. 5B and 5C, the slot jets 32, as a result of aspiration, tend to generate a suction effect. Accordingly, a surface placed generally parallel to the end wall 12 will be attacted and held at that surface.

For purposes of illustration, the device of FIG. 6 employing a two-piece metal-to-metal structure may have slots 32 approximately 0.5 inches long by 0.25 inches deep and 0.03125 inches wide. The feed grooves 34 are approximately 0.015625 inches square and approximately 0.15625 inches long. It has been found that a long narrow groove passage defining the slots is much more effective than a short plate orifice. In operation, the device of FIG. 6 can be operated over a wide range of flow supply pressures. It is capable of effectively picking up and holding flexible as well as rigid materials. For example, at a supply pressure of approximately 4 psig, materials such as tissue paper, cloth or wafers are easily attracted and held by the transfer head. At the same time, flow consumption requirements are modest because of the small feed groove dimensions. Inherently, the pumping action of the slots produces a more extensive suction action due to the flow behavior in the slot regions. Hence, wider variations in sheet-head positioning can be tolerated without adverse effects on performance. Stated differently, accurate registration between the green sheet supply and the pick-up head is more readily tolerated in the device in accordance with the FIG. 6 embodiment.

Figure 7A:
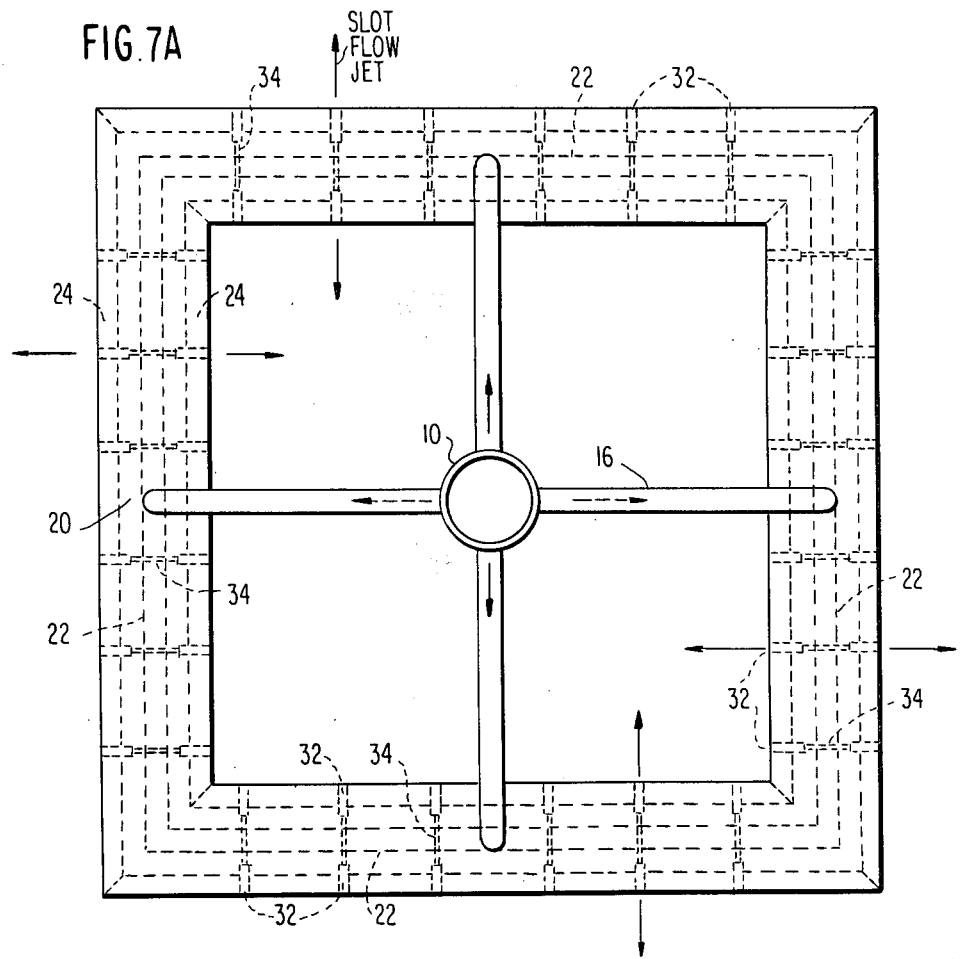
FIG. 7A and FIG. 7B are plan and side elevation views respectively of a third embodiment of this invention.
Figure 7B:
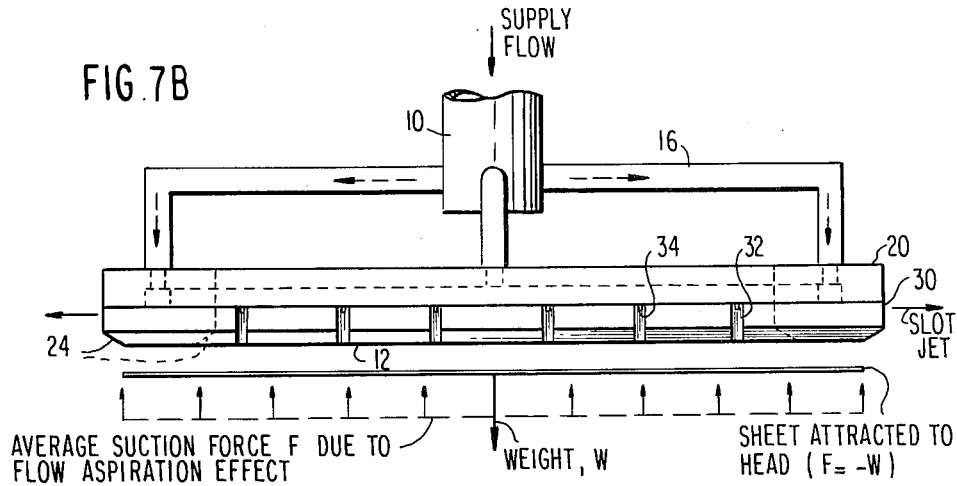

A third preferred embodiment of this invention is shown in FIGS. 7A and 7B. This configuration of a green sheet pick-up head utilizes the same aspirator jet suction techniques of the FIG. 6 embodiment in the context of a larger pick-up head configuration. As shown in FIG. 7A, a supply from nozzle 10 is directed into a feed manifold as shown in FIG. 7A comprises four segments each feeding air into portions of the pick-up head having a plenum 22. The plenum 22 extends circumferentially about the device wherein each segment comprises a top member 20 and a bottom member 30. A series of radially directed slots 32 radiate from the plenum 22 in a manner corresponding to that of the embodiment of FIG. 6. A slot jet flow therefore emanates from the slots 32 in a manner corresponding to the prior embodiment. As shown in FIG. 7B, corner portions of member 30 are beveled at surfaces 24 to tailor the extent of the surface in contact with the green sheet. That is, the bottom surface 12 is selectively varied by the extent of the bevel 24 on both sides of the lower surface 12. Consequently, the amount of green sheet surface area which contacts surface 12 can be optimized as a function of that bevel. Also as in the FIG. 5 embodiment, the corners of each slot may be radiused to improve flow characteristics.

FIG. 7B shows an average suction force F which is due to the aspiration effect of air released by the slots 32. When that force equals and counteracts the weight of the green sheet, the sheet is attached to the head, that is, attached to surface 12.

The embodiment of FIG. 7 illustrates a symmetrical manifold arrangement from a common inlet source. Consequently, air issuing from the multiple slots 32 generates a suction which attracts in a uniform manner the approaching sheet to the surface 12. Given the sensitive nature of the green sheet material, the beveling construction, while not affecting the suction operation of the device, allows minimum yet effective contact to occur.

As pointed out herein, the present invention represents a significant departure from other suction devices since it does not require a vacuum pump. The problems of clogging and accurate registration with the lifting device are eliminated. It is apparent that other embodiments of a transfer and pick-up head may be built in accordance with the teachings of this invention without departing from its essential scope. For example, while a rectangular head with an outer ring of slots is shown, the head may have a shape consistent with the planar shape of the objects to be lifted. Moreover, since the device uses the aspirated air flow characteristics to achieve integrated suction effects encompassing a larger region than conventional vacuum devices, the placement of slots may be varied to define other arrays.

In this invention, the focused aspiration flow characteristics of a partially enclosed gas jet move parallel to the planar surface of a flexible sheet. This flow condition manifests itself as a continuously generated suction effect in the region bounded by the slot and sheet surfaces. At the same time, the parallel gas stream induces a boundary layer frictional force on the sheet acting in the direction of the flow. By providing the array of slots as shown in the preferred embodiments, the aggregate effect of these forces is to lift and hold the sheet on the head. Accordingly, following these principles a number of different slot arrangements may be defined. While not illustrated the slot or slots may be curved or sinuous. The slots need not be directed radially outward, but as pick-up conditions dictate, be offset or skewed vis-a-vis the center of the pick-up head. Also, since the invention finds application for use with flexible materials, it is apparent that it can be employed to lift rigid wafers.

We claim:

1. A pick-up head for moving a sheet of material comprising:
   an input port for receiving a supply of gas under positive pressure,
   a pick-up surface having slot means therein extending outward to a peripheral edge of said pick-up surface with an opening on said pick-up surface to establish a gas flow generally parallel to said pick-up surface, and means establishing fluid communication between said input port and said slot means wherein an aspired flow of gas is created through said openings as gas issues from said means establishing fluid communication for discharge from said slot means along the peripheral edge of said pick-up surface to define said gas flow, thereby creating a suction force between said pick-up surface and a sheet of material to be moved.

2. The pick-up of claim 1, wherein said slot means comprises a series of slots extending outward to the peripheral edges of said pick-up surface.

3. The pick-up head of claim 2, wherein said means establishing fluid communication comprises a plenum chamber within said pick-up head and a series of feed grooves between said plenum chamber and respective slots.

4. The pick-up head of claim 3, wherein said pick-up head comprises two co-planar plates and plenum chamber and input port disposed in one plate and said feed grooves and slots are disposed in a second plate.

5. The pick-up head of claim 4, wherein said plenum chamber extends in a first direction and said slots extend in a second direction orthogonal to the first direction.

6. The pick-up head of claim 3, wherein said means establishing fluid communication further comprises a gas feed manifold coupling said input port to said plenum.

7. The pick-up head of claim 4, wherein said pick-up head comprises an array of coupled co-planar plates, each of said co-planar plates having said plenum chamber in one plate and said feed grooves and slots in a second plate and said manifold establishing fluid communication to each of said plenum chambers.

8. The pick-up head of claim 7, wherein said plenum chambers are in direct fluid communication with each other.

9. The pick-up head of claim 8, wherein said pick-up surface has a beveled edge.

10. An aspirator suction pick-up head comprising:
    an input port receiving a supply of gas under positive pressure,
    a flat pick-up surface having a network of extending slots with openings on the pick-up surface and its periphery to establish a gas flow generally parallel to said pick-up surface, and means to establish fluid communication between said slots and said input port wherein gas is aspirated by said gas flow into said slots from said openings on the pick-up surface and discharged along with gas from said supply at openings along the periphery of said pick-up surface to create a suction between said pick-up surface and a sheet of material to be transported.

11. The pick-up head of claim 10, wherein said means establishing fluid communication comprises a plenum chamber within said pick-up head and a series of feed grooves between said plenum chamber and respective slots.

12. The pick-up head of claim 11, wherein said pick-up head comprises two co-planar plates and plenum chamber and input port disposed in one plate and said feed grooves and slots are disposed in a second plate.

13. The pick-up head of claim 12, wherein said plenum chamber extends in a first direction and said slots extend in a second direction orthogonal to the first direction.

14. The pick-up head of claim 11, wherein said means establishing fluid communication further comprises a gas feed manifold coupling said input port to said plenum.

15. The pick-up head of claim 14, wherein said pick-up head comprises an array of coupled co-planar plates, each of said co-planar plates having said plenum chamber in one plate and said feed grooves and slots in a second plate and said manifold establishing fluid communication to each of said plenum chambers.

16. The pick-up head of claim 15, wherein said plenum chambers are in direct fluid communication with each other.

17. The pick-up head of claim 16, wherein said pick-up surface has a beveled edge.

18. The pick-up head of claim 10, wherein said slots extend radially outward to the periphery of said pick-up surface.

* * * * *

UNITED STATES PATENT AND TRADEMARK OFFICE
CERTIFICATE OF CORRECTION

PATENT NO. : 4,474,397
DATED : October 2, 1984
INVENTOR(S) : J.K. Hassaan, et al It is certified that error appears in the above-identified patent and that said Letters Patent is hereby corrected as shown below:

Column 2, line 60 "velocity v." should read --velocity $\underline{v}$.--;

Column 3, line 9 "velocity, v," should read --velocity, $\underline{v}$,--;

Column 3, line 13 "spacing, h," should read --spacing, $\underline{h}$,--;

Column 3, line 39 "velocity v" should read --velocity $\underline{v}$--;

Column 3, line 59 "$t = t_f \cdot h = h_f$" should read $$--t = t_f : h = h_f--.$$

Signed and Sealed this

Fifteenth Day of April 1986

[SEAL]

Attest:

DONALD J. QUIGG

Attesting Officer      Commissioner of Patents and Trademarks